(12) United States Patent
Yokoyama et al.

(10) Patent No.: US 6,179,910 B1
(45) Date of Patent: Jan. 30, 2001

(54) METHOD FOR MANUFACTURING SILICON SINGLE CRYSTALS AND WAFERS ADAPTED FOR PRODUCING SEMICONDUCTORS

(75) Inventors: Takashi Yokoyama; Shin Matsukuma; Toshiaki Saishoji; Kozo Nakamura; Junsuke Tomioka, all of Hiratsuka (JP)

(73) Assignee: Komatsu Electronic Metals Co., LTD (JP)

( * ) Notice: Under 35 U.S.C. 154(b), the term of this patent shall be extended for 0 days.

(21) Appl. No.: 09/396,107

(22) Filed: Sep. 14, 1999

(30) Foreign Application Priority Data

Sep. 14, 1998 (JP) .................................. 10-260666
Mar. 23, 1999 (JP) .................................. 11-078666

(51) Int. Cl.[7] .................................. C30B 15/20
(52) U.S. Cl. .................................. 117/20; 117/20
(58) Field of Search .................................. 117/13, 20, 26

(56) References Cited

U.S. PATENT DOCUMENTS

| 4,809,196 | * | 2/1989 | Miller | 364/550.01 |
| 5,840,120 | * | 11/1998 | Kim et al. | 117/208 |
| 5,972,106 | * | 10/1999 | Ohta et al. | 117/13 |

FOREIGN PATENT DOCUMENTS

| 61-193456 | 8/1986 | (JP) . |
| 03080338 | 4/1991 | (JP) . |
| 10-208987 | 8/1998 | (JP) . |

OTHER PUBLICATIONS

Materials Science Forum "Growth Parameters Determining the Type of Grown–in Defects in Czockralski Silicon Crystals," vols. 196–201 (1995) pp. 1713–1718.

* cited by examiner

Primary Examiner—Felisa Hiteshew
(74) Attorney, Agent, or Firm—Sheppard, Mullin, Richter & Hampton LLP

(57) ABSTRACT

This invention provides a method for manufacturing silicon single crystals. The method is capable of eliminating void defects existing in deep regions of a silicon single crystal despite the size of the silicon single crystal. The silicon single crystals according to this invention are pulled the radius of a ring-shaped oxidation induced stacking fault (OSF ring) of a wafer is larger than half the radius of the wafer during the process of thermal oxidation treatment.

6 Claims, 3 Drawing Sheets

METHOD FOR MANUFACTURING SILICON SINGLE CRYSTALS AND WAFERS ADAPTED FOR PRODUCING SEMICONDUCTORS

BACKGROUND OF THE INVENTION

1. Field of the Invention

This invention relates to a method for manufacturing silicon single crystals and relates to wafers adapted for producing semiconductors. In particular, this invention relates to a method for manufacturing CZ silicon single crystals suitable for high-temperature heat treatments of CZ silicon wafers in a hydrogen atmosphere (hereinafter referred as hydrogen heat treatment). Furthermore, this invention relates to wafers that are cut out from single crystals manufactured by the above method and undergo a hydrogen heat-treatment to get rid of defects formed therein.

2. Description of the Related Art

Most substrates used for fabricating semiconductor components are silicon single crystals, which are dominantly manufactured by the CZ method. In the CZ method, polycrystalline silicon is fed into a crucible and is heated to melt into a liquid. Then, a seed crystal disposed in a seed chuck is immersed into the liquid stored in the crucible; subsequently, the seed is rotated and pulled to grow a silicon single crystal of preset diameter and length.

Silicon single crystals acquired through the above process are sliced to obtain wafers, and subsequently devices are mounted on the activated surfaces of the wafers. However, due to the tendency of miniaturization and high-integration of device structures, the voltage endurance characteristic of a gate oxidation layer has become highly important. Japanese Patent Gazette JB HEI 3-80338 disclosed a method for reducing defects contained in the gate oxidation layer during its forming process. The '338 patent suggested heat-treating a silicon wafer in a non-oxidizing atmosphere containing hydrogen gas prior to the process of forming a thermal oxidation thin layer on the surface of the silicon wafer. It has been known that grown-in defects contained in a CZ silicon wafer disappear after a hydrogen heat treatment and the oxidation layer voltage endurance characteristic of the treated CZ silicon is excellent. The above grown-in defects, such as LSTD (Laser Scattering Tomograghy Defects), FPD (Flow Pattern Defects), or COP (Crystal Originated Particle),can be detected near the outer surface layer of a wafer.

However, the distinguishable outcome brought about by hydrogen heat treatment can only be found near the most outer surface layer of the wafer. The inventors of this invention noticed that the smaller the defect size, the better the result of eliminating defects achieved through hydrogen heat treatment. Therefore, a proposal (Japanese Patent Application No. HEI 9-27213) was offered. Namely, the proposal is a method for raising the cooling rate while passing through the defect producing temperature zone in the process of pulling a crystal so as to miniaturize the defect sizes.

However, when a silicon single crystal diameter is over 200 mm, the heat capacity is larger than that of conventional small-diameter silicon single crystals; it is quite difficult to obtain a cooling rate capable of miniaturizing the defect sizes to a significant extent. In other words, due to insufficient cooling in the process of the pulling operation, it is quite difficult to eliminate defects existing in large silicon ingots with the aid of hydrogen heat treatment.

SUMMARY OF THE INVENTION

The object of this invention is to provide a method for manufacturing silicon single crystals capable of eliminating void defects existing in deep regions of a silicon single crystal despite its size.

It is another object of this invention to provide a wafer adapted for producing semiconductors, which is manufactured according to the above method and maintains a great defect-free depth.

In view of the above-mentioned problems, the inventors of this invention intended to find a method, other than adjusting the cooling rate, capable of eliminating defects during pulling a CZ silicon single crystal. They investigated the ratios (V/G) between the pulling speeds (V) of silicon single crystals and the temperature gradients (G) along the crystal axes under various conditions so as to acquire a control factor. The temperature gradients were measured at a temperature near melting point and at sites located in the central portions of the crystals being pulled.

On the whole, it is well-known that grown-in defects existing in the interior of the ring-shaped oxidation induced stacking fault (OSF ring) contained in a CZ silicon single crystal are different from those existing in the exterior of the OSF ring which is induced during a thermal oxidation treatment. Void defects existing in the interior of the OSF ring are considered as an aggregate of vacancies, which will deteriorate the reliability of the gate oxidation layer in MOS devices. Dislocation clusters existing in the exterior of the OSF ring are regarded as self-interstitilals cohesion bodies, which will also deteriorate the characteristics of semiconductor components. In addition, it has been reported that the above defect seeds relate to the pulling speeds (V) of silicon single crystals and the above temperature gradients (G) along crystal axes (M. Hourai et. al. 18$^{th}$ International Conference on Defects in Semiconductors (1995)). Usually, elevating the pulling speed of a silicon single crystal can get rid of OSF rings to avoid current leak, which is caused by the existence of dislocation clusters and happens at pn junction surfaces.

After investigating the control factor, namely the ratios (V/G) between the pulling speeds (V) of silicon single crystals and the temperature gradients (G) along the crystal axes, the inventors found that defects could be removed from the zone extending from the outer surface to a depth of at least 3 $\mu$m. In other words, when an OSF ring began to appear on the outer periphery of a wafer cut out from a silicon single crystal, specifically under a condition of V/G values being smaller than 0.25 mm$^2$/° C. min and the radius of the OSF ring being larger than half the radius of the wafer, the silicon single crystal could be made free of dislocation clusters and defects therein could be removed by a hydrogen heat treatment from the zone extending from the outer surface to a depth of at least 3 $\mu$m.

Therefore, to achieve the above objects, in the method for manufacturing silicon single crystals according to this invention, silicon single crystals are pulled under a condition that the radius of a ring-shaped oxidation induced stacking fault (OSF ring) of a wafer is larger than half the radius of the wafer during the process of thermal oxidation treatment.

Furthermore, the method for manufacturing silicon single crystals according to this invention is characterized in that the ratios (V/G) between the pulling speeds (V) of silicon single crystals and the temperature gradients (G) along the crystal axes are smaller than 0.25 mm$^2$/° C. min and the radius of the each OSF ring is larger than half the radius of the wafer.

Furthermore, wafers adapted for producing semiconductors according to this invention are made of silicon single crystals pulled under a condition that the radius of a ring-shaped oxidation induced stacking fault (OSF ring) of the wafer is larger than half the radius of the wafer during the process of thermal oxidation treatment, and the wafers are heat-treated by hydrogen gas or non-oxidation gas so as to eliminate void defects.

Alternatively, wafers adapted for producing semiconductors according to this invention are made of silicon single crystals pulled under a condition of V/G values being smaller than 0.25 mm$^2$/° C. min and the radius of the each OSF ring being larger than half the radius of the wafer, and the wafers are heat-treated by hydrogen gas or non-oxidation gas so as to eliminate void defects.

Furthermore, this invention intends to provide silicon single-crystal wafers adapted for annealing, characterized in that void defects contained therein have sizes smaller than 120 nm. Moreover, in order to meet the above requirements, in the Czochralski method, it is appropriate to pull silicon single crystals on the following conditions:

$$C.R. > 2.0 \times (1-\exp(-15.35 \times (V/G-0.15)))^{2.5}, V/G > 0.15, \text{ and } 2 > C.R.$$

wherein V denotes pulling speeds (mm/min), G denotes temperature gradients (° C./mm) along the crystal axis measured at sites near solid-liquid boundary (the zone in which defect patterns are determined), and C. R. denotes cooling rates (° C./min) at a temperature near 1120° C. (the temperature zone in which void defects are formed).

As a general concept, this invention provides a method for miniaturizing the sizes of void defects contained in a pulled silicon single crystal by controlling the pulling condition in order to reduce the C. R. value in response to the decrease of the V/G values during the process of manufacturing silicon single crystals by the Czochralski method.

BRIEF DESCRIPTION OF THE DRAWINGS

The present invention can be more fully understood by reading the subsequent detailed description of embodiments with references made to the accompanying drawings.

DETAILED DESCRIPTION OF THE PREFERRED EMBODIMENTS

Scattering intensities incurred by the size of void defects contained in the wafers cut out from silicon single crystal were inspected by taking the V/G value as a control factor. The V/G value is the ratio between the pulling speed (V) of a silicon single crystal and the temperature gradients (G), measured at a temperature near melting point at sites along its crystal axis. The crystal with added dopant Boron is of 200-mm diameter, P type, and has crystal orientation <100>. Growing conditions such as hot zones and pulling speeds were altered and divided into 17 levels.

Figure 1:
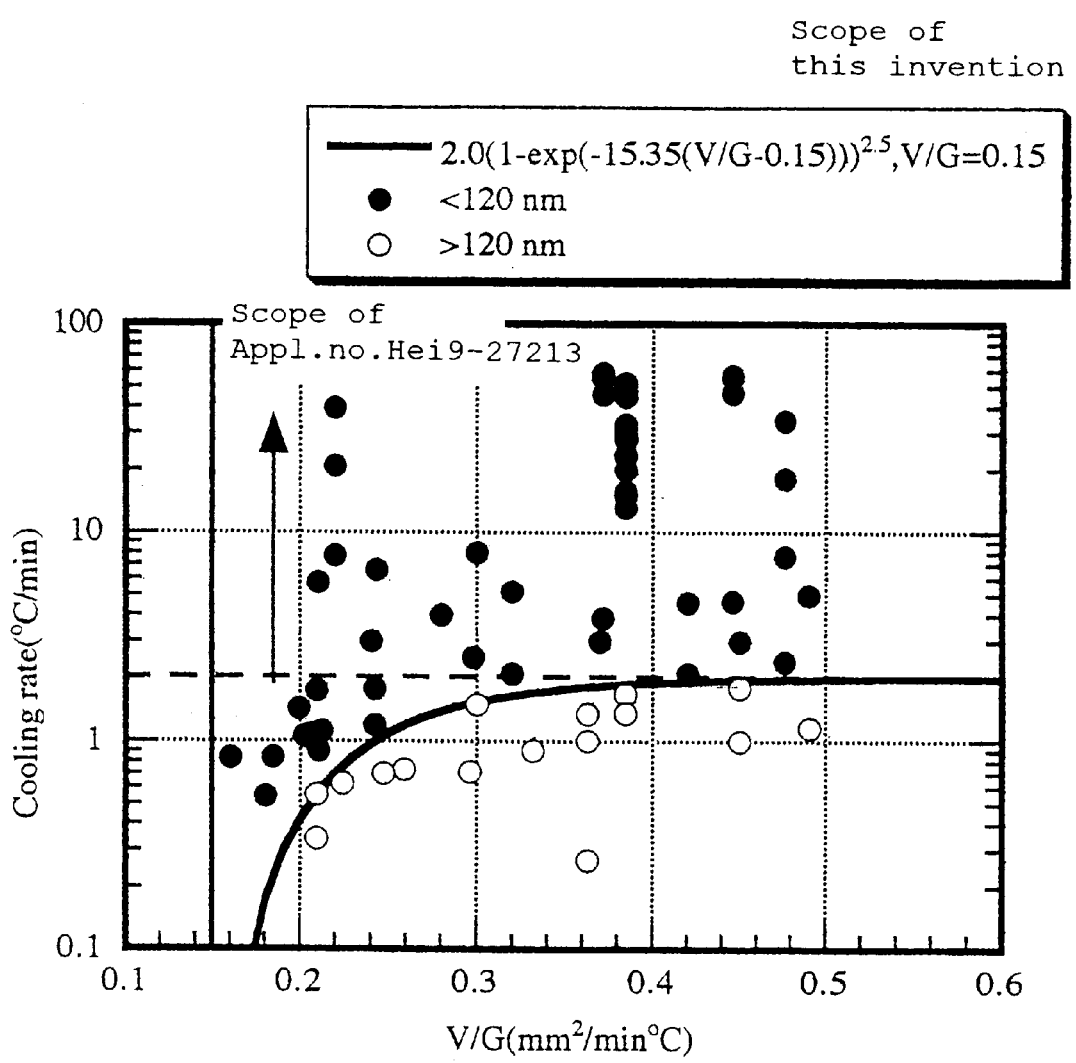
FIG. 1 is a graph showing the relationship between scattering intensity of the void defects and V/G, wherein V/G is the ratio between the pulling speed (V) of a silicon single crystal and the temperature gradients (G), measured at a temperature near melting point at sites along its crystal axis.

The relationship between scattering intensities of the void defects and V/G values obtained from the above sample is shown in FIG. 1. It was found that the scattering intensities (measured by infrared scattering tomography), taken as the substitute for defect sizes, decline when V/G values are smaller than 0.25 mm$^2$/° C. min (see FIG. 1).

Figure 2:
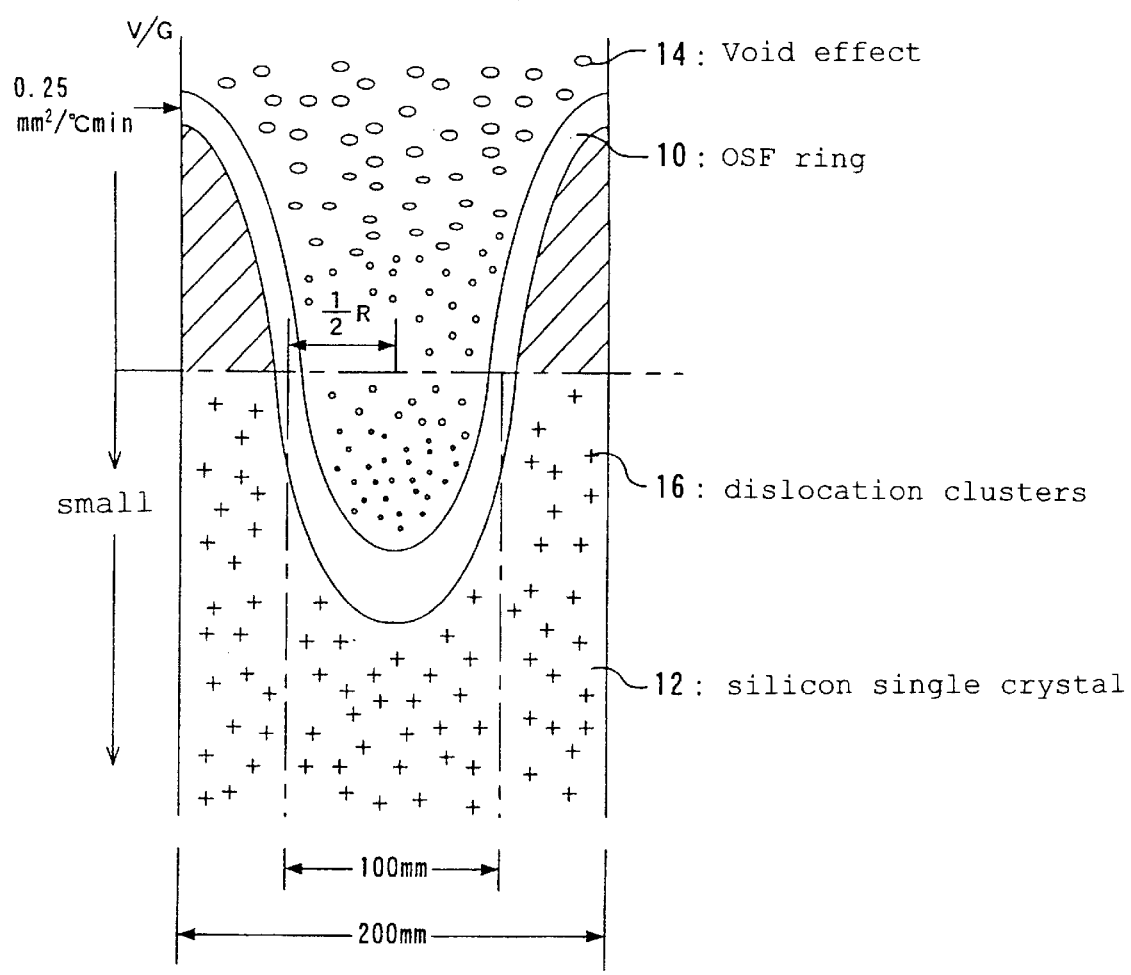
FIG. 2 is a graph showing the relationship between OSF ring contained in a silicon single crystal and V/G, wherein V/G is the ratio between the pulling speed (V) of the silicon single crystal and the temperature gradients (G), measured at a temperature near melting point at sites along its crystal axis.

However, due to the existence of exterior zone of the OSF ring within the range of these V/G values, there exists a possibility of giving birth to dislocation clusters. FIG. 2 shows the emerging of OSF rings in response to the variation of V/G values. When the V/G value reduces to a value smaller than 0.25 mm$^2$/° C. min, OSF ring 10 begins to appear on the outer periphery of the silicon single crystal 12. The smaller the V/G value is, the closer the OSF ring approaches the center of the silicon single crystal 12. Void defects 14 could be found in the interior of the OSF ring. However, as shown in FIG. 2, void defects get smaller following the decrease of the V/G values. The exterior of the OSF ring 10 expands following the decrease of the V/G values. It is possible that dislocation clusters could be found: therefore, inspections for the arising of dislocation clusters and tests on the effect of hydrogen heat treatment were performed. The results are listed in Table 1.

TABLE 1

| | | After hydrogen heat treatment | | | | | | |
|---|---|---|---|---|---|---|---|---|
| No. | Non-defective percentage in as-grown state (%) | Non-defective percentage as after hydrogen heat treatment (%) | Non-defective percentage after removing 3 μm by polishing (%) | Dislocation clusters arise or not | Radius of OSF ring (mm) | V (mm/min) | G (° C./mm) | V/C (mm$^2$/° C. min) |
| Conventional cases | | | | | | | | |
| 1 | 53.7 | 100.0 | 55.9 | Not arise | Not appear | 0.70 | 2.65 | 0.264 |
| 2 | 50.8 | 100.0 | 55.4 | Not arise | Not appear | 0.65 | 2.30 | 0.283 |
| 3 | 56.5 | 99.4 | 59.3 | Not arise | Not appear | 0.75 | 2.75 | 0.273 |
| 4 | 62.1 | 100.0 | 62.7 | Not arise | Not appear | 0.63 | 2.50 | 0.252 |
| 5 | 98.9 | 100.0 | 100.0 | Arise | Not appear | 0.40 | 2.65 | 0.151 |
| 6 | 100.0 | 98.9 | 100.0 | Arise | Not appear | 0.40 | 2.30 | 0.174 |
| 7 | 98.3 | 100.0 | 100.0 | Arise | Not appear | 0.40 | 2.75 | 0.145 |
| 8 | 99.4 | 100.0 | 99.4 | Arise | Not appear | 0.40 | 2.50 | 0.160 |
| 9 | 90.4 | 100.0 | 100.0 | Arise | 25.0 | 0.50 | 2.65 | 0.189 |
| 10 | 74.0 | 98.3 | 98.9 | Arise | 48.0 | 0.50 | 2.30 | 0.217 |

TABLE 1-continued

| | | After hydrogen heat treatment | | | | | | |
|---|---|---|---|---|---|---|---|---|
| No. | Non-defective percentage in as-grown state (%) | Non-defective percentage as after hydrogen heat treatment (%) | Non-defective percentage after removing 3 μm by polishing (%) | Dislocation clusters arise or not | Radius of OSF ring (mm) | V (mm/min) | G (° C./mm) | V/C (mm²/° C. min) |
| 11 | 89.8 | 100.0 | 100.0 | Arise | 23.0 | 0.50 | 2.75 | 0.182 |
| 12 | 80.2 | 100.0 | 100.0 | Arise | 36.0 | 0.50 | 2.50 | 0.200 |
| This invention | | | | | | | | |
| 13 | 62.7 | 100.0 | 100.0 | Not arise | 75.0 | 0.60 | 2.50 | 0.240 |
| 14 | 72.9 | 99.4 | 100.0 | Not arise | 50.0 | 0.50 | 2.40 | 0.208 |
| 15 | 69.5 | 100.0 | 99.4 | Not arise | 64.0 | 0.53 | 2.40 | 0.221 |
| 16 | 57.6 | 100.0 | 100.0 | Not arise | 77.0 | 0.56 | 2.40 | 0.233 |
| 17 | 49.7 | 100.0 | 97.2 | Not arise | 90.0 | 0.60 | 2.40 | 0.250 |

V: pulling speed
G: temperature gradients along crystal axes at a temperature ranging from melting point to 1350

Based on the results listed in Table 1, it is found that dislocation clusters will not arise in a wafer in which the radius of its OSF ring is larger than half the radius of the wafer (see the hatching area in FIG. 2). Furthermore, in the as-grown state, the non-defective percentages regarding the oxidation layer voltage endurance of mirror-surface wafers, which are grown under various CZ conditions, intensely fluctuate from 50% to 100%. However, the non-defective percentages of the all wafers under various CZ conditions were enhanced to a value of about 100% after a hydrogen heat treatment of 1200° C.×1 hr was performed thereon.

As shown in Table 1, the wafers can be divided into two groups. One group are those whose oxidation layer voltage endurance enhanced by hydrogen heat treatment remarkably deteriorated (almost returned to the as-grown state) after removing a surface layer of 3 μm thickness by polishing. The other group maintained their oxidation layer voltage endurance enhanced by hydrogen heat treatment. It has been confirmed that the critical V/G value is 0.25 mm²/° C. min. Following the miniaturization and high-integration of device structures, the importance of flawless wafer surface is increasing. In consideration of the above, the wafers formerly mentioned would negatively effect device yield. It is that a defect-free layer of at least several-microns thickness is the sole requirement to silicon wafers.

Therefore, it is essential to keep V/G values smaller than 0.25 mm²/° C. min and to keep the radius of the OSF ring larger than half the radius of the wafer. By this means, the silicon single crystal can be made free of dislocation clusters and defects can be removed from the zone extending from the outer surface to a depth of at least 3 μm through a hydrogen heat treatment.

According to this invention, any CZ or MCZ silicon single crystal wafer could serve as a substrate for hydrogen heat treatment. Furthermore, the atmosphere for heat-treating wafers could be non-oxidizing gas such as Ar or He, and a mixture of hydrogen and these non-oxidizing gases.

EMBODIMENT TWO

Because the smaller the defect size, the better the effect obtained through hydrogen heat treatment, the relationship between defect sizes and effect obtained through hydrogen heat treatment was investigated in this embodiment. Ranges of growing conditions within which defect sizes can be reduced to achieve the expected result were determined. Furthermore, a defect-free zone of 3 μm depth from the outer surface is essential to devices; therefore the required defect-free depth should be larger than 3 μm.

Crystals are grown under different conditions (such as V/G and C.R.) affecting defect sizes, and wafers are cut out from the crystals, wherein, V denotes pulling speed (mm/min), G denotes temperature gradients (° C./mm) along the crystal axis measured at sites near solid-liquid boundary (the zone in which defect patterns are determined), and C. R. denotes cooling rates (° C./min) at a temperature near 1120° C. (the temperature zone in which void defects are formed). The scattering intensities of LSTD with respect to the above wafers were investigated (MITSUI Metal Mining Co; MO401), and defect sizes were determined by employing analytic curves. In addition, after a hydrogen heat treatment had been performed at 1200° C. for 1 hour, a surface layer of 3 μm thickness was removed by polishing so as to inspect the non-defective percentages of oxidation layer voltage endurance.

The results are listed in Table 2 and Table 3. Table 2 and Table 3 list pulling speeds V (mm/min), temperature gradients G (° C./mm) along the crystal axis measured at sites near the solid-liquid boundary, V/G, cooling rates C. R. (° C./min) at a temperature near 1120° C., defect sizes, and the results for oxidation layer voltage endurance after hydrogen heat treatment and removing a surface layer of 3 μm thickness by polishing. The oxidation layer voltage endurance was measured under the conditions of an oxidation layer of thickness 25 nm and an electrode of area 10 mm². In Tables 2 and 3, "o" denotes that the C-mode yield, which is judged as almost defects are vanished, is larger than 95%. "x" denotes that the percentage of C-mode is less than 95%.

TABLE 2

| G °C./mm | V mm/min | V/G mm²/°C.min | Cooling Rate °C./mm | Size nm | The result after removing 3 μm by polishing |
|---|---|---|---|---|---|
| 3.36 | 0.81 | 0.24 | 1.78 | 115.6 | ○ |
| 3.20 | 0.64 | 0.20 | 1.44 | 106.5 | ○ |
| 2.53 | 0.53 | 0.21 | 0.90 | 112.3 | ○ |
| 2.72 | 0.50 | 0.18 | 0.84 | 109.6 | ○ |
| 2.99 | 0.72 | 0.24 | 1.19 | 117.4 | ○ |
| 2.87 | 0.59 | 0.21 | 1.02 | 106.4 | ○ |
| 2.96 | 0.48 | 0.16 | 0.83 | 79.1 | ○ |
| 2.20 | 0.57 | 0.26 | 0.73 | 147.3 | " |
| 2.05 | 0.43 | 0.21 | 0.56 | 156.5 | " |
| 1.97 | 0.36 | 0.18 | 0.54 | 101.7 | ○ |
| 2.16 | 0.54 | 0.25 | 0.70 | 140.9 | " |
| 2.09 | 0.47 | 0.22 | 0.62 | 128.8 | " |
| 6.18 | 1.30 | 0.21 | 5.73 | 93.7 | ○ |
| 6.18 | 1.50 | 0.24 | 6.62 | 97.7 | ○ |
| 2.45 | 0.52 | 0.21 | 1.12 | 97.7 | ○ |
| 2.43 | 0.50 | 0.21 | 1.08 | 97.5 | ○ |
| 2.42 | 0.49 | 0.20 | 1.06 | 88.6 | ○ |
| 3.50 | 1.30 | 0.37 | 3.88 | 102.9 | ○ |
| 3.50 | 1.30 | 0.37 | 55.28 | 39.3 | ○ |
| 3.50 | 1.30 | 0.37 | 58.01 | 40.8 | ○ |
| 3.50 | 1.30 | 0.37 | 45.93 | 56.6 | ○ |
| 3.50 | 1.56 | 0.45 | 4.66 | 104.3 | ○ |
| 3.50 | 1.56 | 0.45 | 55.28 | 37.8 | ○ |
| 3.50 | 1.56 | 0.45 | 56.79 | 40.2 | ○ |
| 3.50 | 1.56 | 0.45 | 46.43 | 46.3 | ○ |
| 1.80 | 0.40 | 0.22 | 39.35 | 41.0 | ○ |
| 1.80 | 0.40 | 0.22 | 20.82 | 46.0 | ○ |
| 1.80 | 0.40 | 0.22 | 7.76 | 101.5 | ○ |
| 1.80 | 0.86 | 0.48 | 2.40 | 119.5 | ○ |
| 1.80 | 0.86 | 0.48 | 7.71 | 101.6 | ○ |
| 1.80 | 0.86 | 0.48 | 18.06 | 73.4 | ○ |
| 1.80 | 0.86 | 0.48 | 34.38 | 49.6 | ○ |
| 1.80 | 0.69 | 0.38 | 1.36 | 136.6 | " |
| 1.80 | 0.69 | 0.38 | 52.09 | 36.0 | ○ |
| 1.80 | 0.69 | 0.38 | 31.65 | 60.9 | ○ |
| 1.80 | 0.69 | 0.38 | 1.36 | 134.2 | " |
| 1.80 | 0.69 | 0.38 | 32.76 | 59.0 | ○ |
| 1.80 | 0.69 | 0.38 | 1.36 | 140.6 | " |
| 1.80 | 0.69 | 0.38 | 23.68 | 53.5 | ○ |
| 1.80 | 0.69 | 0.38 | 14.84 | 83.9 | ○ |
| 1.80 | 0.69 | 0.38 | 1.68 | 164.7 | " |
| 1.80 | 0.69 | 0.38 | 30.86 | 56.8 | ○ |
| 1.80 | 0.69 | 0.38 | 1.36 | 141.3 | " |
| 1.80 | 0.69 | 0.38 | 23.39 | 56.2 | ○ |
| 1.80 | 0.69 | 0.38 | 31.75 | 51.8 | ○ |
| 1.80 | 0.69 | 0.38 | 29.21 | 64.8 | ○ |
| 1.80 | 0.69 | 0.38 | 1.36 | 153.4 | " |
| 1.80 | 0.69 | 0.38 | 23.17 | 52.2 | ○ |

TABLE 3

| G °C./mm | V mm/min | V/G mm²/°C.min | Cooling Rate °C./mm | Size nm | The result after removing 3 μm by polishing |
|---|---|---|---|---|---|
| 1.80 | 0.69 | 0.38 | 13.16 | 83.3 | ○ |
| 1.80 | 0.69 | 0.38 | 32.06 | 34.9 | ○ |
| 1.80 | 0.69 | 0.38 | 29.21 | 53.9 | ○ |
| 1.80 | 0.69 | 0.38 | 20.06 | 70.3 | ○ |
| 1.80 | 0.69 | 0.38 | 1.36 | 144.5 | " |
| 1.80 | 0.69 | 0.38 | 48.73 | 37.9 | ○ |
| 1.80 | 0.69 | 0.38 | 1.36 | 128.9 | " |
| 1.80 | 0.69 | 0.38 | 50.35 | 34.6 | ○ |
| 1.80 | 0.69 | 0.38 | 31.36 | 60.4 | ○ |
| 1.80 | 0.69 | 0.38 | 1.36 | 151.4 | " |
| 1.80 | 0.69 | 0.38 | 50.13 | 37.8 | ○ |
| 1.80 | 0.69 | 0.38 | 31.36 | 52.6 | ○ |
| 1.80 | 0.69 | 0.38 | 1.36 | 140.3 | " |
| 1.80 | 0.69 | 0.38 | 15.70 | 43.5 | ○ |
| 1.80 | 0.69 | 0.38 | 23.25 | 38.2 | ○ |
| 1.80 | 0.69 | 0.38 | 27.88 | 59.3 | ○ |

TABLE 3-continued

| G °C./mm | V mm/min | V/G mm²/°C.min | Cooling Rate °C./mm | Size nm | The result after removing 3 μm by polishing |
|---|---|---|---|---|---|
| 1.80 | 0.69 | 0.38 | 1.36 | 116.0 | ○ |
| 1.80 | 0.69 | 0.38 | 44.65 | 30.8 | ○ |
| 1.80 | 0.65 | 0.36 | 1.36 | 161.4 | " |
| 3.50 | 0.73 | 0.21 | 1.75 | 116.1 | ○ |
| 3.50 | 1.04 | 0.30 | 2.50 | 119.9 | ○ |
| 1.50 | 0.54 | 0.36 | 1.00 | 160.2 | " |
| 1.68 | 0.82 | 0.49 | 1.17 | 156.9 | " |
| 1.80 | 0.60 | 0.33 | 0.90 | 168.6 | " |
| 2.12 | 0.63 | 0.30 | 0.71 | 189.9 | " |
| 3.50 | 0.73 | 0.21 | 0.34 | 181.0 | " |
| 1.80 | 0.65 | 0.36 | 0.27 | 187.5 | " |
| 2.20 | 0.62 | 0.28 | 4.00 | 103.6 | ○ |
| 2.20 | 0.66 | 0.30 | 1.50 | 148.7 | " |
| 2.20 | 0.66 | 0.30 | 8.00 | 85.1 | ○ |
| 2.20 | 0.70 | 0.32 | 2.10 | 116.1 | ○ |
| 2.20 | 0.70 | 0.32 | 5.20 | 100.6 | ○ |
| 2.20 | 0.92 | 0.42 | 2.10 | 113.1 | ○ |
| 2.20 | 0.53 | 0.24 | 3.00 | 101.2 | ○ |
| 2.20 | 0.81 | 0.37 | 3.00 | 115.1 | ○ |
| 2.20 | 0.99 | 0.45 | 3.00 | 117.8 | ○ |
| 2.20 | 1.08 | 0.49 | 5.00 | 108.2 | ○ |
| 2.20 | 0.92 | 0.42 | 4.60 | 110.2 | ○ |
| 2.20 | 1.00 | 0.45 | 1.80 | 124.5 | " |
| 2.20 | 1.00 | 0.45 | 1.00 | 126.5 | " |

Based on the results listed in Tables 2 and 3, it is learned that when defect sizes are less than 120 nm, satisfactory oxidation layer voltage endurance can be maintained in the surface layer of 3 μm thickness.

Figure 3:
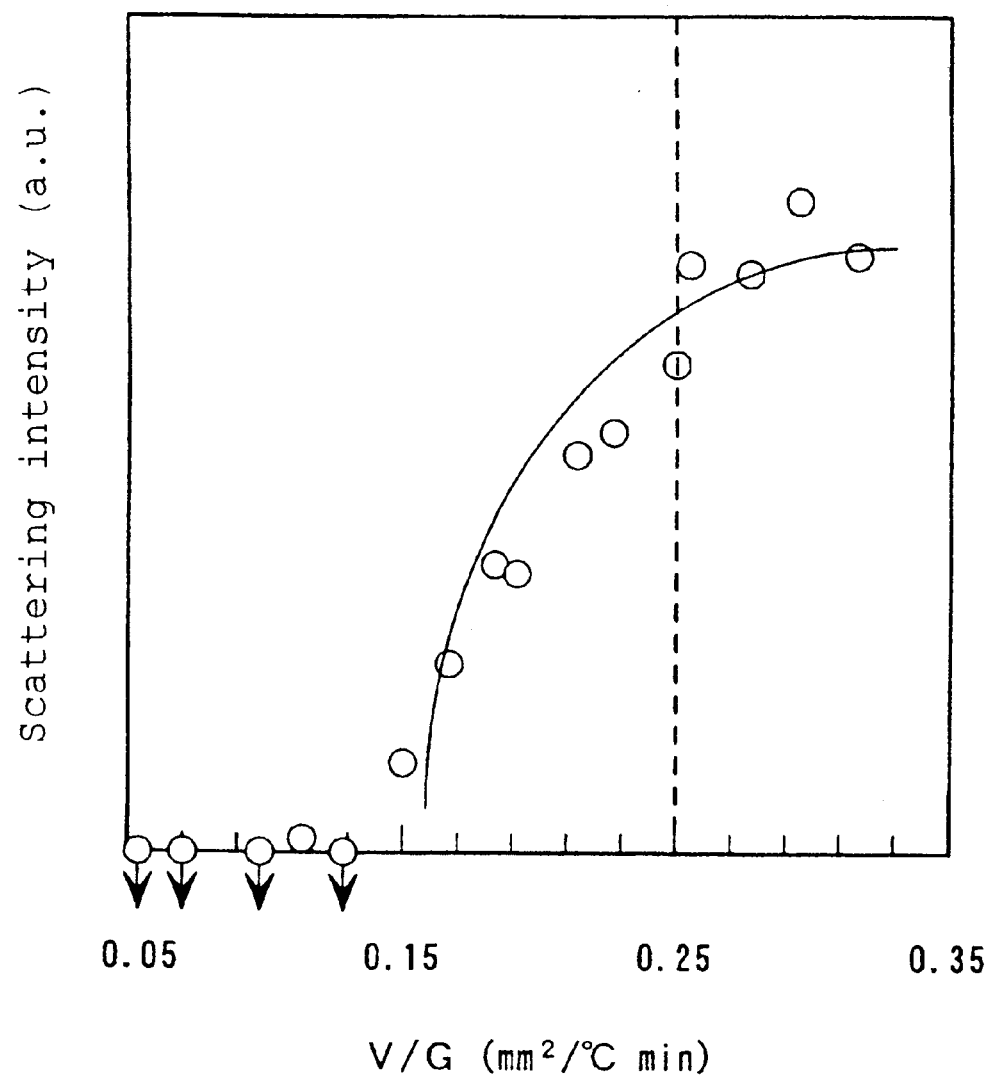
FIG. 3 is a graph showing the relationship between V/G values and cooling rates corresponding to the occasions that defect sizes are respectively larger and smaller than 120nm.

FIG. 3 is a graph showing the relationship between V/G values and cooling rates corresponding to the occasions that defect sizes are respectively larger and smaller than 120 nm. Black dots in FIG. 3 denote the occasion that defect sizes are smaller than 120 nm and effective (the percentage of vanished defects is greater than 95% and the defects are judged as C-mode). White dots denote the occasion that defect sizes are larger than 120 nm and ineffective (the percentage of vanished To determine the function representing the boundary between the black dots and the white dots, the following equation can be obtained:

$$C.R.=2.0\times(1-\exp(-15.35\times(V/G-0.15)))^{2.5}$$

Therefore, in order to reduce defect size to an amount smaller than 120 nm, it is suitable to adjust conditions to meet the following equation:

$$C.R.>2.0\times(1-\exp(-15.35\times(V/G-0.15)))^{2.5}$$

According to previous experiences, dislocation clusters arise in the whole wafer if $V/G \leq 0.15$. This will deteriorate the characteristic of PN junction current leak, and wafers pulled within the above scope ($V/G \leq 0.15$) are not suitable for producing devices. Therefore, the above scope should not be taken into consideration, and an additional restriction ($V/G>0.15$) should be imposed on the above equation $C.R.>2.0\times(1-\exp(-15.35\times(V/G-0.15)))^{2.5}$.

Furthermore, Japanese Patent Gazette JA HEI 9-27213 disclosed a method for manufacturing crystals suitable for hydrogen heat treatment and suggested that 2<C. R. This invention further discloses that crystals suitable for hydrogen heat treatment can be obtained in the scope of V/G value being smaller than 0.3 mm²/°C. min, even if cooling speeds are not greater than 2° C./min. In view of the above, the restriction (2<C. R.) mentioned in Japanese Patent Gazette JA HEI 9-27213 should be taken into consideration (the claimed scope of HEI 9-27213 is also shown in FIG. 3). Thus, the scope for producing silicon single crystals suitable for annealing is newly suggested as follows:

$$C.R.=2.0\times(1-\exp(-15.35\times(V/G-0.15)))^{2.5}, V/G>0.15, \text{ and } 2>C.R.$$

As described above, it is possible, without changing the conditions of hydrogen heat treatment, to produce wafers capable of boosting the effect of hydrogen heat treatment to a greater depth and being free of dislocation clusters by employing the CZ silicon single crystals manufactured according to this invention.

What is claimed is:

1. A method for manufacturing silicon single crystals characterized in that:

the silicon single crystals are pulled under a condition that the radius of a ring-shaped oxidation induced stacking fault (OSF ring) of a wafer is larger than half the radius of the wafer during the process of thermal oxidation treatment.

2. A method for manufacturing silicon single crystals characterized in that:

the ratios (V/G) between the pulling speeds (V) of silicon single crystals and the temperature gradients (G) along the crystal axes are smaller than 0.25 mm²/° C. min at a temperature near melting point and the radius of each OSF ring is larger than half the radius of the wafer.

3. A method for manufacturing silicon single crystals characterized in that:

the silicon single crystals are pulled under the conditions $$C.R.=2.0\times(1-\exp(-15.35\times(V/G-0.15)))^{2.5}, V/G>0.15, \text{ and } 2>C.R.$$

wherein, V denotes pulling speeds (mm/min), G denotes temperature gradients (° C./mm) along the crystal axis measured at sites near solid-liquid boundary (the zone in which defect patterns are determined), and C. R. denotes cooling rates (° C./min) at a temperature near 1120° C. (the temperature zone in which void defects are formed).

4. A method for miniaturizing the sizes of void defects contained in a pulled silicon single crystal, by controlling the pulling condition in order to reduce the C. R. value in response to the decrease of the V/G values during the process of manufacturing silicon single crystals by the Czochralski method.

5. A method for manufacturing silicon single crystal wafers suitable for non-oxidizing atmosphere heat treatment, characterized in that:

the silicon single crystals are pulled under a condition that the radius of a ring-shaped oxidation induced stacking fault (OSF ring) of a wafer is larger than half the radius of the wafer during the process of thermal oxidation treatment.

6. A method for manufacturing silicon single crystal wafers suitable for non-oxidizing atmosphere heat treatment, characterized in that:

the ratios (V/G) between the pulling speeds (V) of silicon single crystals and the temperature gradients (G) along the crystal axes are smaller than 0.25 mm$^2$/° C. min and the radius of the OSF ring is larger than half the radius of the wafer.

* * * * *